United States Patent
Tsorng et al.

(10) Patent No.: US 10,762,025 B1
(45) Date of Patent: Sep. 1, 2020

(54) SWAPPABLE ADD-ON CARD MODULE

(71) Applicant: QUANTA COMPUTER INC., Taoyuan (TW)

(72) Inventors: Yaw-Tzorng Tsorng, Taoyuan (TW); Chun Chang, Taoyuan (TW); Ting-Kuang Pao, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/297,140

(22) Filed: Mar. 8, 2019

(51) Int. Cl.
*G06F 13/40* (2006.01)
*G06F 13/42* (2006.01)

(52) U.S. Cl.
CPC ...... *G06F 13/4081* (2013.01); *G06F 13/4282* (2013.01); *G06F 2213/0026* (2013.01)

(58) Field of Classification Search
CPC ..... G06F 13/4018; G06F 3/4081; H05K 7/00; H05K 7/14; H05K 5/00
See application file for complete search history.

(56) References Cited

U.S. PATENT DOCUMENTS

| | | | | |
|---|---|---|---|---|
| 7,101,188 B1* | 9/2006 | Summers | ............ | H01R 12/721 439/59 |
| 7,684,208 B2* | 3/2010 | Okamoto | ............ | H05K 7/1487 361/754 |
| 8,050,029 B1* | 11/2011 | Kam | ................ | H05K 7/20727 312/236 |
| 8,199,511 B2* | 6/2012 | Kim | .................... | H05K 7/1461 312/223.1 |
| 8,369,092 B2 | 2/2013 | Atkins et al. | | |
| 10,001,819 B2 | 6/2018 | Heyd et al. | | |
| 2003/0046452 A1* | 3/2003 | Andrewartha | .......... | G06F 1/181 710/2 |
| 2006/0023422 A1 | 2/2006 | Shum et al. | | |
| 2009/0097200 A1* | 4/2009 | Sharma | .................... | G06F 1/18 361/688 |
| 2011/0317351 A1* | 12/2011 | Pizzolato | ................. | G06F 1/20 361/679.4 |
| 2012/0134086 A1 | 5/2012 | Zhang | | |
| 2016/0044820 A1 | 2/2016 | Xu et al. | | |
| 2016/0255740 A1* | 9/2016 | Ping | ...................... | G06F 13/362 710/301 |
| 2016/0259754 A1* | 9/2016 | Ping | ...................... | G06F 3/0688 |

FOREIGN PATENT DOCUMENTS

CN 108919900 A 11/2018
TW M512154 U 11/2015

OTHER PUBLICATIONS

TW Office Action for Application No. 108118801, dated Feb. 27, 2020, w/ First Office Action Summary.
TW Search Report for Application No. 108118801, dated Feb. 27, 2020, w/ First Office Action.
Extended European Search Report for EP Application No. 19193943.8, dated Mar. 31, 2020.

* cited by examiner

*Primary Examiner* — Tim T Vo
*Assistant Examiner* — Phong H Dang
(74) *Attorney, Agent, or Firm* — Nixon Peabody LLP

(57) ABSTRACT

The present disclosure provides a swappable card module for a computer component. The swappable card module can be configured to positioned in either the front side or back side of a server system. Some examples of the present disclosure provide for a card module holding at least one computer card, an adapter board, and a module housing.

13 Claims, 9 Drawing Sheets

SWAPPABLE ADD-ON CARD MODULE

FIELD

The present disclosure relates to a swappable add-on card module for a server system.

BACKGROUND

As the server industry develops and matures, server system designs are becoming more complex, with more varied architecture. Add-on card modules in a server system allow computer cards of certain sizes to fit into matching locations (in the server system) that might have shapes or sizes that differ from the selected computer card. For example, an add-on module can provide structural support for a smaller card to fit into a larger space in the server system. However, such add-on cards are typically non-swappable, that is, they are received in a single location in a server system. Therefore, if a user needs to switch the orientation of a server system so that a particular side of the server system is accessible by the user, an add-on card can become inaccessible. For example, if an add-on card that is typically accessed from a front side needs to be accessed from a rear side due to the change in orientation of the server system, a conventional add-on card module remains in the front side, and cannot be relocated to the rear side.

These concerns and restrictions in the orientation of a server system creates a demand for add-on card modules to have high compatibility and flexibility in what the expansion card holds, and where, in the server system, that the expansion card can be placed. However, conventional add-on card modules do not provide this flexibility.

Therefore, there is a need for an add-on card module that can be installed at different locations within a server system.

SUMMARY

The various examples of the present disclosure are directed towards a card module. The card module can include an adapter board and a module housing. The adapter board can receive at least one computer card, and the module housing can receive the adapter board. The module housing can have a first end with at least one opening. The at least one opening can receive a first portion of the at least one computer card. In some examples, the card module can fit within a front portion or a back portion of a server system.

In some examples, the adapter board can receive the at least one computer card via at least one receiving element. In some examples, the adapter board can include at least one connector element. The connector element can couple with an external computer component. The external component can be, for example, a mother board of a server system. The connector element can electrically connect with the at least one receiving element via electrical connections in the adapter board. Therefore, in some examples, the at least one receiving element and the at least one connector element can configure the at least one computer card to receive and transmit data with the external computer component.

The module housing can include a second end on an opposite end of the module housing as the first end. In some examples, the second end can have a second opening corresponding to the at least one connector element.

In some examples, the card module can be a PCIe module.

A second embodiment of the present disclosure can provide for at least one removable computer component and at least one card module. The at least one removable computer component can be located in a first opening at a front portion of a server system. The at least one card module can be located in a second opening at a rear portion of the server system. The at least one card module can include at least one computer card, an adapter board, and a module housing. Further examples and characteristics of the at least one card module can be as described above, with respect to the first embodiment.

In some examples, the server system can provide for a first configuration where the at least one removable computer component is located at the front portion of the server system, and the at least one card module is located at the rear portion of the server system. The server system can also provide for a second configuration where the at least one removable computer component is located at a rear portion of the server system, and the at least one card module is located at the front portion of the server system.

In some examples, the at least one computer component and the at least one card module are configured to removably exchange positions in the server system.

In some examples, the at least one removable computer component can be housed in an expander module. The expander module can include a module housing, an adapter element, and the at least one removable computer component.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The accompanying drawings exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

Figure 1A:
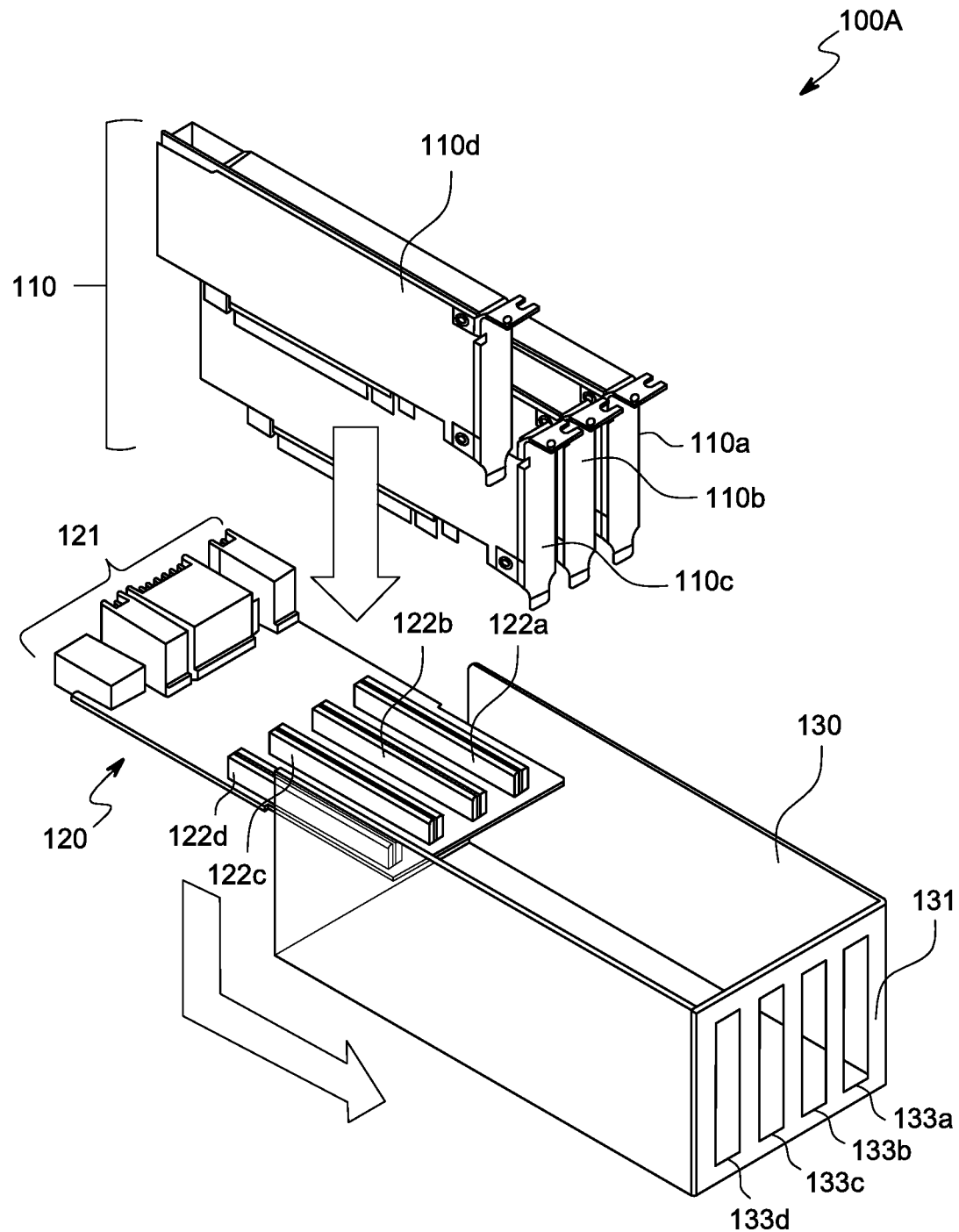
FIG. 1A shows an exploded view of an exemplary add-on card module, according to an embodiment of the present disclosure.

The present invention is described with reference to the attached figures, where like reference numerals are used throughout the figures to designate similar or equivalent elements. The figures are not drawn to scale, and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The present disclosure provides for a swappable add-on card module for at least one computer component. The swappable add-on card module can fit into both a front portion and a rear portion of a server system, according to a desired design of the server system. In some examples of the present disclosure, the swappable add-on card module can removably exchange with another computer component in the computer system (such as a fan module). In some examples, said computer component can have a module housing so that a sizing of said computer component matches a sizing of the swappable add-on card module. In some examples of the present disclosure, the swappable add-on card module can be a PCIe module.

Therefore, the present disclosure provides for server system components that have high compatibility and flexibility to be placed in various locations in a server system. This answers an increasing need in the server industry for user accessibility to expansion cards from either end of a server system, according to a current orientation of the server system.

Figure 1B:
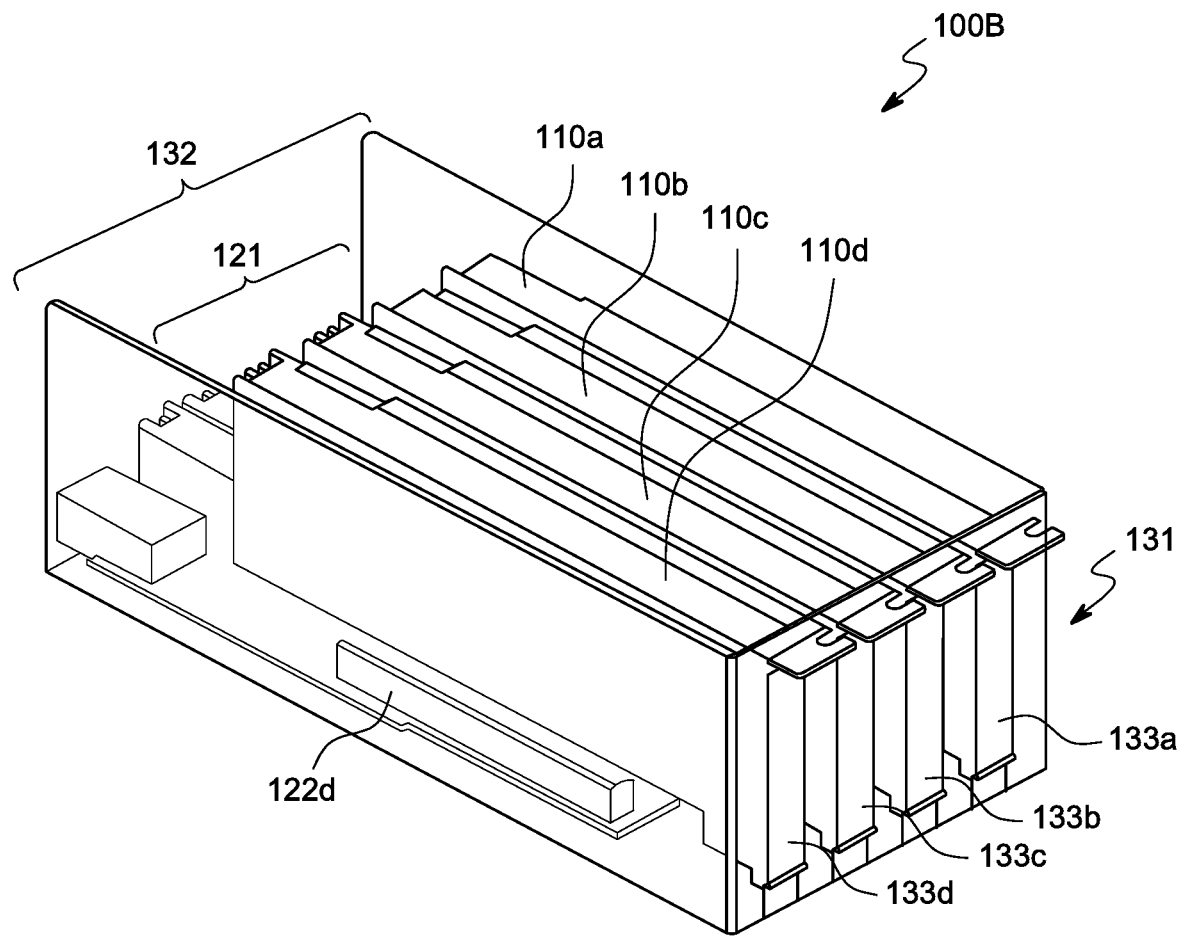
FIG. 1B shows an exemplary add-on card module in a loaded position, according to an embodiment of the present disclosure.

FIG. 1A shows an exploded view of an exemplary add-on card module 100A, according to an embodiment of the present disclosure. The card module 100A can include at least one computer card 110, an adapter board 120, and a module housing 130. FIG. 1B shows a loaded configuration 100B of an exemplary add-on card module 100A, according to an embodiment of the present disclosure. Various features of the add-on card module 100A and the loaded configuration 100B are discussed further below.

The at least one computer card 110 can be any computer component configured to plug into a server system, for example, PCIe cards. The adapter board 120 can receive the at least one computer card 110 via at least one receiving element 122. The adapter board 120 can have a plurality of receiving elements 122a, 122b, 122c, and 122d to receive a corresponding plurality of computer cards 110a, 110b, 110c, and 110d. Each receiving element 122a, 122b, 122c, and 122d can mechanically and electrically couple with a corresponding computer card 110a, 110b, 110c, and 110d such that the at least one computer card 110 can receive and transmit data through the adapter board 120. The adapter board 120 can further comprise at least one connector element 121 to mechanically and electrically couple with an external computer component (shown in FIG. 2B). The at least one connector element 121 provides communication channels for the adapter board 120 to receive and transmit data with the external computer component. Therefore, when in the loaded configuration 100B, the electrical connections between the computer card 110, the at least one receiving element 122, the at least one connector element 121, and the external computer component allow the at least one computer card 110 to communicate with the external computer component.

The module housing 130 provides structural support for the at least one computer card 110 and the adapter board 120. The module housing 130 can have a first end 131 and a second end 132. The first end 131 can have at least one opening 133. For example, the module housing 130 can have a plurality of openings 133a, 133b, 133c, and 133d to receive an end portion of a corresponding plurality of computer cards 110a, 110b, 110c, and 110d. These openings 133a, 133b, 133c, and 133d can allow for cables to attach to the plurality of computing cards 110a, 110b, 110c, and 110d. Openings 133a, 133b, 133c, and 133d can also receive PCIe brackets, other input/output modules, or other types of add-on cards.

The second end 132 can be an opposing end of the module housing 130 from the first end 131 and can have a second opening corresponding to the at least one connector element 121. When the loaded add-on card module 100B is loaded into a server system, the at least one connector element 121 can be configured to receive an external computer component, and the first end 131 of the module housing 130 can be accessible by a user.

Figure 2A:
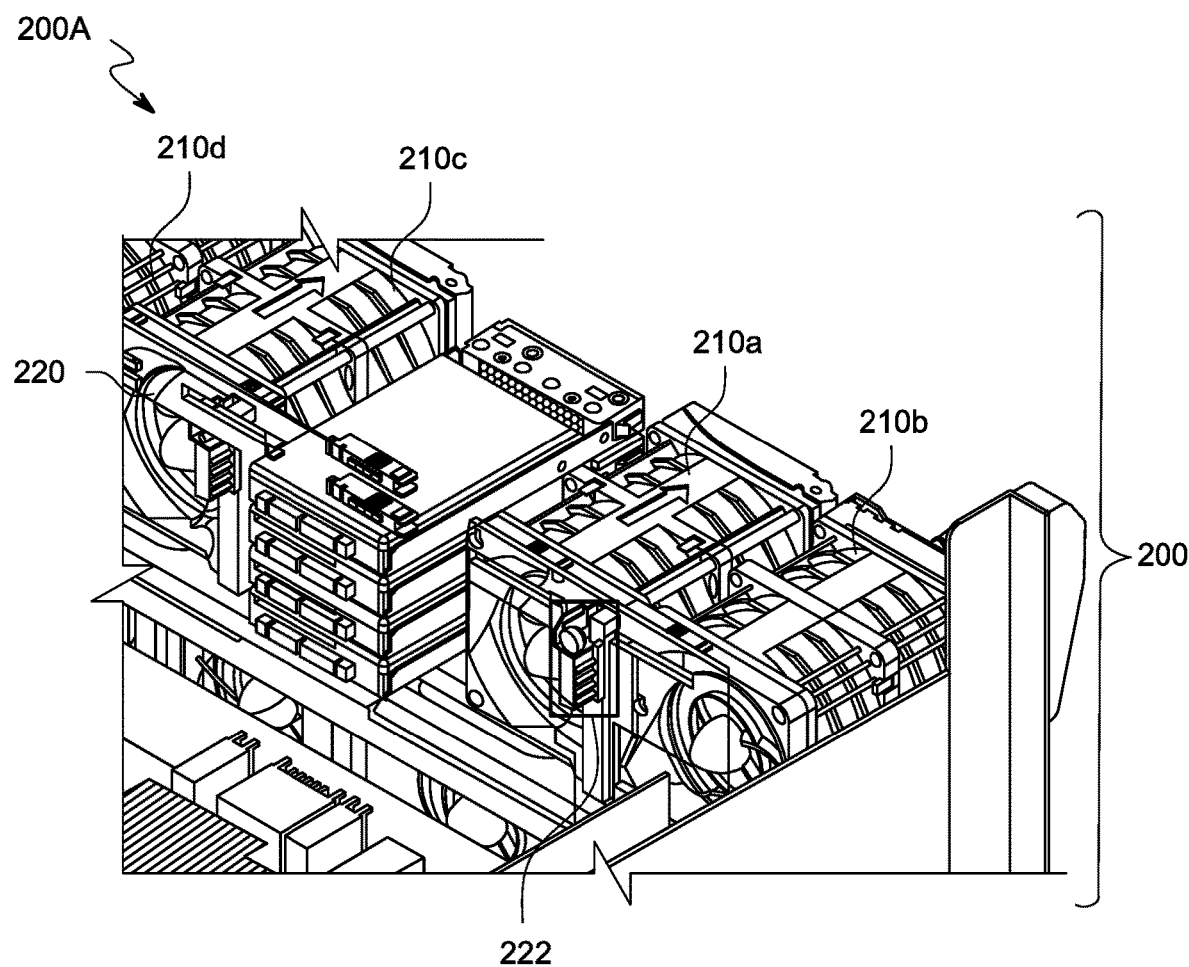
FIG. 2A shows an exemplary zoomed-in view of a loaded fan in a front portion of a server system, according to an embodiment of the present disclosure.

FIG. 2A shows an exemplary first configuration 200A for a front portion of a server system 200, according to an embodiment of the present disclosure. Configuration 200A can provide for a plurality of fans 210a, 210b, 210c, and 210d loaded into a backplane 220 of a server system 200. An exemplary fan, 210a, can connect to the backplane 220 at a connector location in the midplane 222. First configuration 200A shows that the plurality of fans 210a, 210b, 210c, and 210d can be inserted directly into the midplane 222.

Figure 2B:
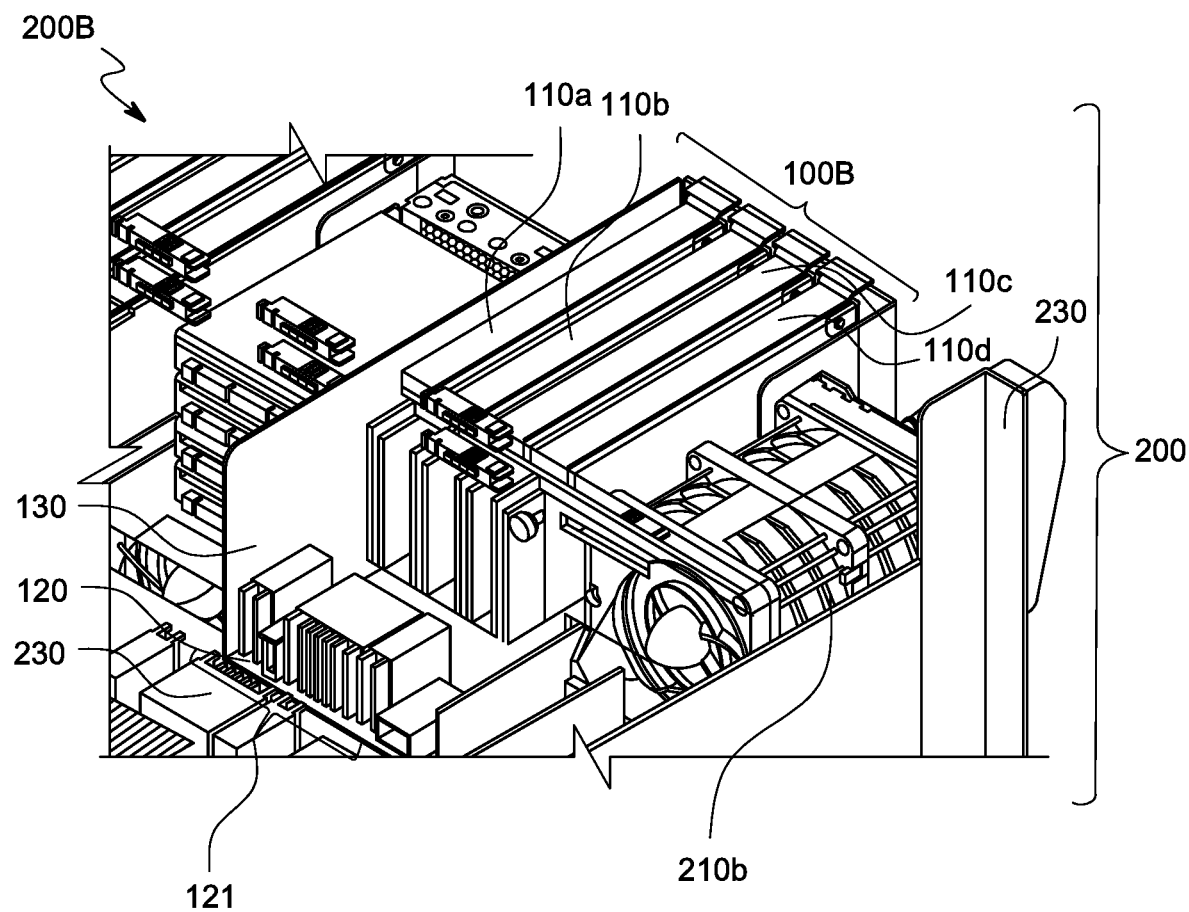
FIG. 2B shows an exemplary zoomed-in view of a loaded add-on card module in a front portion of a server system, according to an embodiment of the present disclosure.

FIG. 2B shows an exemplary second configuration 200B for a front portion of a server system 200, according to an embodiment of the present disclosure. Configuration 200B can include many components and similar labels to components in FIGS. 1-2A. Configuration 200B shows a loaded add-on card module 100B in the place of fan 210a. While fan 210a is connected to the midplane 222, the loaded add-on card module 100B can be received by a motherboard 230. Therefore, a loaded add-on card module 100B, when loaded according to configuration 200B, provides for direct communication between the plurality of computer cards 110a, 110b, 110c, and 110d and a motherboard 230.

FIGS. 2A-2B further demonstrate that the backplane 220 does not need to be altered for the purposes of the present disclosure because the swapping process does not concern any changes to the printed circuit board; rather, the fan modules 210 and add-on card modules 100B connect to different locations (connecting respectively to the backplane 220 and the motherboard 230).

Figure 3A:
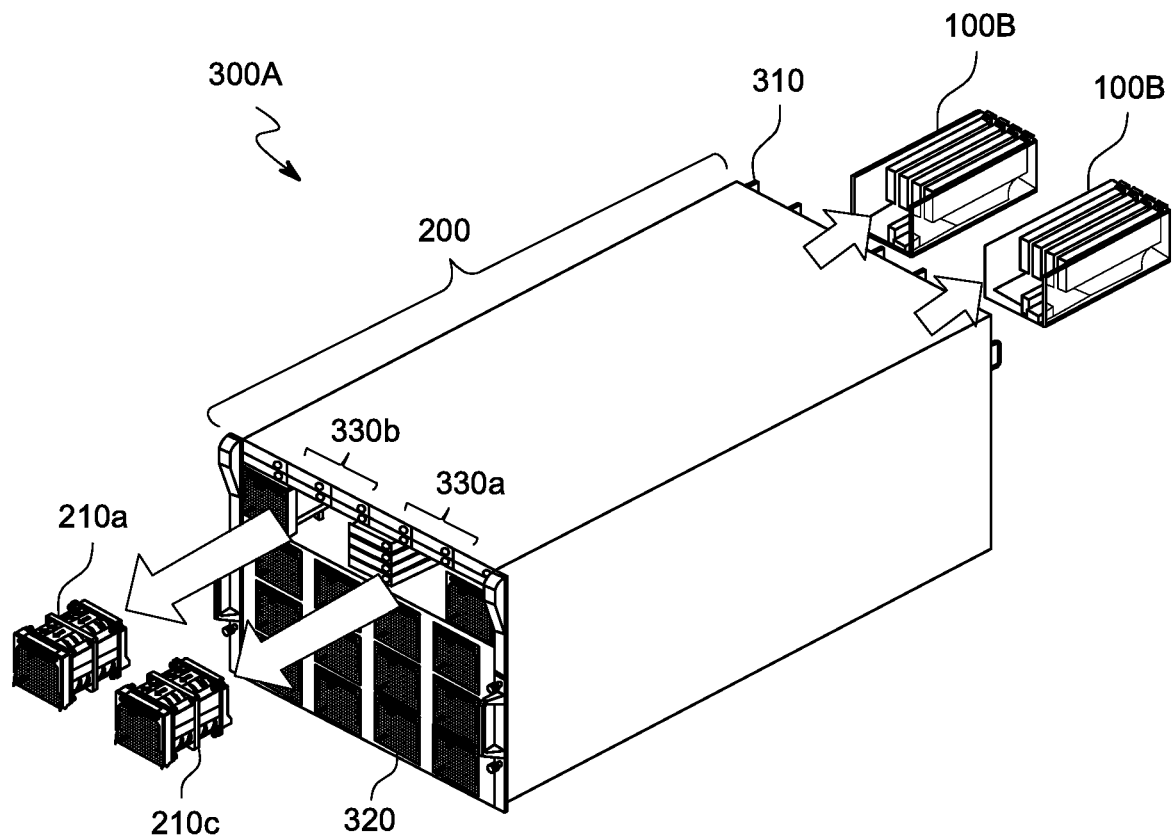
FIGS. 3A-3B show exemplary loaded configurations of swappable add-on card modules in a server system, according to various embodiments of the present disclosure.
Figure 3B:
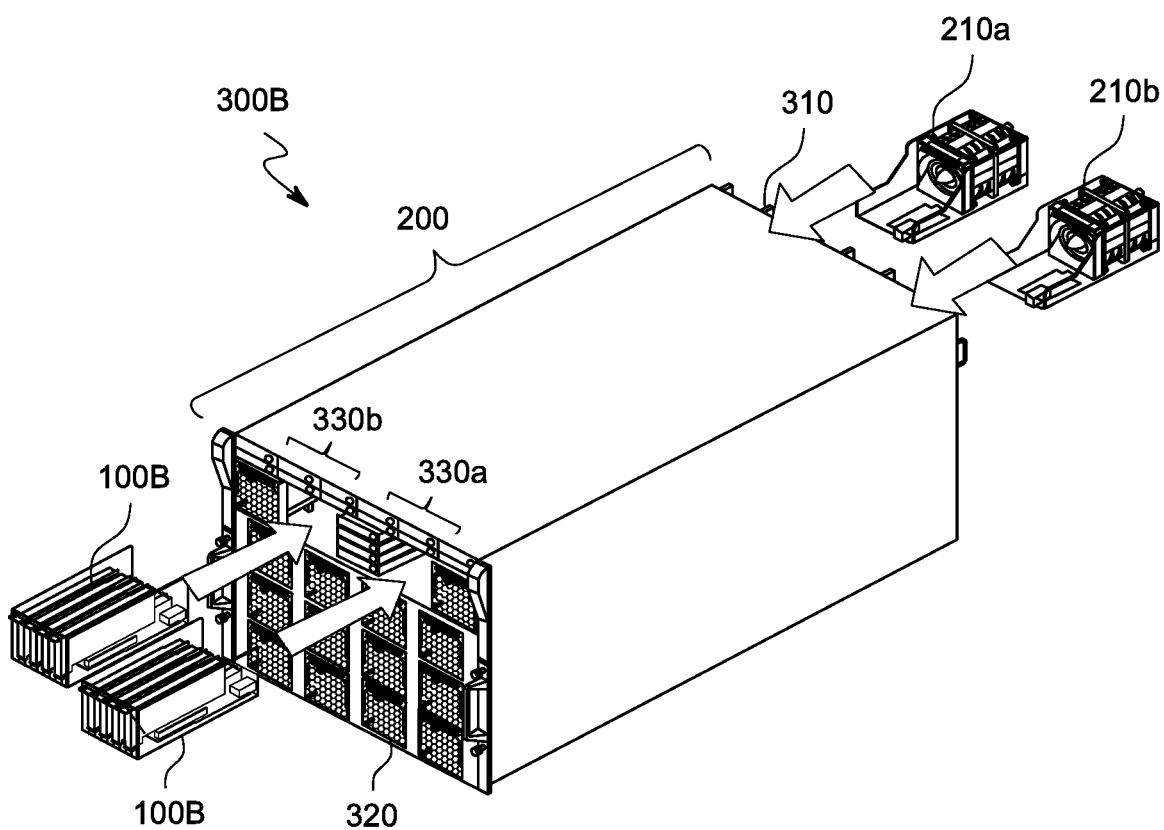

FIGS. 3A-3B show exemplary loaded configurations of swappable add-on card modules in a server system, according to various embodiments of the present disclosure. FIGS. 3A-3B include many components and similar labels to components in FIGS. 1-2B. FIGS. 3A-3B also show a server rear side 310, a server front side 320, at least one opening 330, a first configuration 300A (FIG. 3A), and a second configuration 300B (FIG. 3B).

In the first configuration 300A, fan modules 210a and 210c can be loaded into openings 330b and 330a, respectively, at a front side 320 of the server 200. Add-on card modules 100B can be loaded into a rear side 310 of the server 300 (shown further with respect to FIG. 4A). Therefore, FIG. 3A shows that the present disclosure can provide for a server system 200 that loads computer cards 110 and fan modules 210 into a server system 200 in the same configuration as conventionally used, so that the computer cards 110 are accessible from a rear side 310 of the server 200.

Figure 4A:
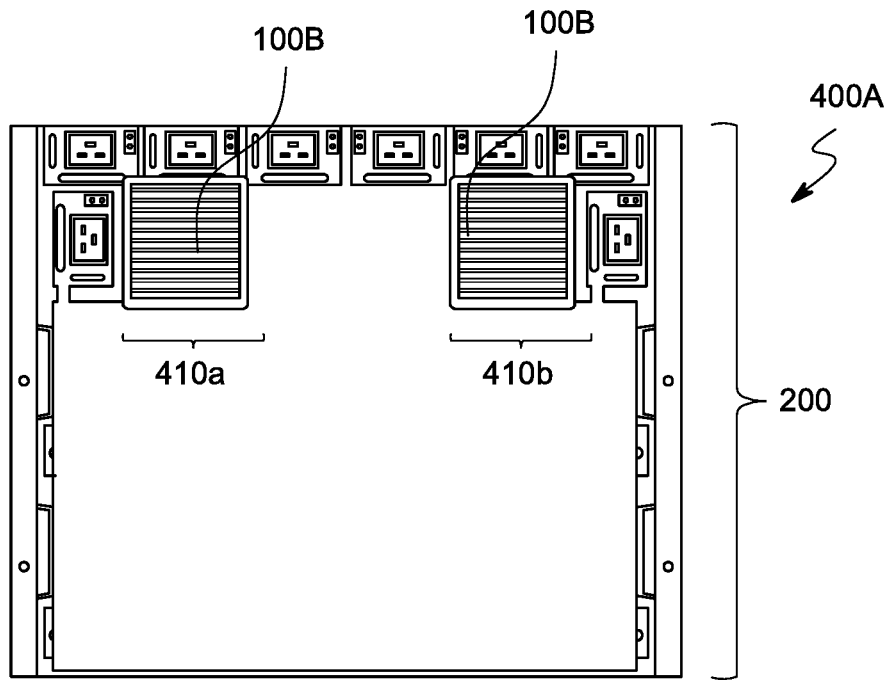
FIGS. 4A-4B show zoomed-in views of exemplary loaded configurations of a rear portion of a server system, according to various embodiments of the present disclosure.
Figure 4B:
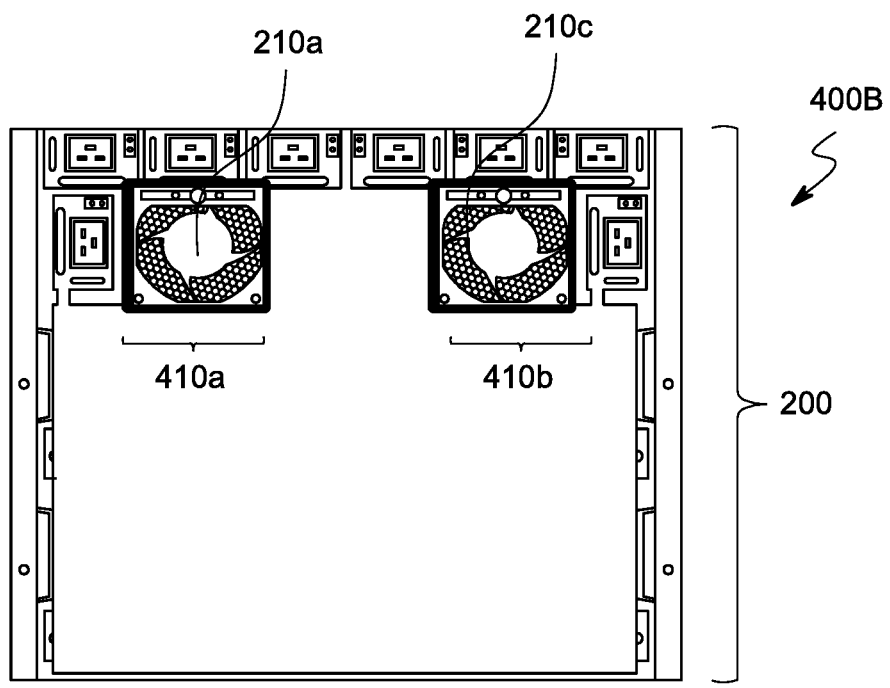

In the second configuration 300B, fan modules 210a and 210c can be loaded into a rear side 310 of the server 300 (shown further with respect to FIG. 4B). Add-on card modules 100B can be loaded into openings 330a and 330b at a front side 320 of the server 200. Therefore, FIG. 3B shows that the add-on card modules 100B can be received in openings at a front side 320 of a server 200 where other computer components (e.g. fans 210a and 210b) would typically be located. This second configuration 300B demonstrates the versatility of add-on card modules 100B, according to an embodiment of the present disclosures.

Although two add-on card modules 100B are shown switching locations with two fan modules 210a and 210b with respect to FIGS. 3A-3B, the present disclosure contemplates that any number of add-on card modules 100B can switch locations with any number of fan modules 210 located in a server system 200.

Additionally, although FIGS. 3A-3B illustrate add-on card modules 100B switching placement locations with fan modules 210, the present disclosure contemplates any the add-on card module 100B can be swapped with any computer component located at the front side 320 of a server system 200. Exemplary computer components can include any components with height and width smaller or equal to the height and width of the fan, including, for example, hard drive modules, solid state drive modules, and input/output port modules. In some examples, the module housing 130 can be sized according to the size of the opening 330 that the add-on card module 100B will be placed into.

FIGS. 4A-4B show zoomed-in views of exemplary loaded configurations of a rear portion of a server system, according to various embodiments of the present disclosure. FIGS. 4A-4B include many components and similar labels to components in FIGS. 1-3B. FIGS. 4A-4B also show a first rear-loaded configuration 400A, a second rear-loaded configuration 400B, a first opening 410a, and a second opening 410b.

FIG. 4A demonstrates a first rear-loaded configuration 400A, corresponding to the first configuration 300A of FIG. 3A. Referring back to FIG. 4A, the first rear-loaded configuration 400A shows how loaded add-on card modules 100B can be received by openings 410a and 410b. These openings 410a and 410b can be spaces configured to receive any computer component. FIG. 4B demonstrates a second rear-loaded configuration 400B, corresponding to the second configuration 300B of FIG. 3B. Referring back to FIG. 4B, the second rear-loaded configuration shows how fan modules 210a and 210c can be received, respectively, by openings 410a and 410b. FIGS. 4A-4B show that fan modules 210a and 210c can be received in the same openings 410a and 410b as add-on card modules 100B are received into.

Therefore, FIGS. 3A-4B demonstrate that swappable add-on card modules 100B, according to an embodiment of the present disclosure, can allow computer cards 110 to removably exchange positions with other computer components of the server system 200 (for example, exchange with fan modules 210).

In addition, the present disclosure contemplates that the swappable add-on card modules 100B can be different sizes from said other computer components of the server system 200 (for example, fan modules 210). Accordingly, the present disclosure provides for expander modules that can house said other computer components such that the expander modules have a similar size to add-on card modules 100B. Various features of exemplary expander modules are discussed further with respect to FIGS. 5A-5B.

Figure 5A:
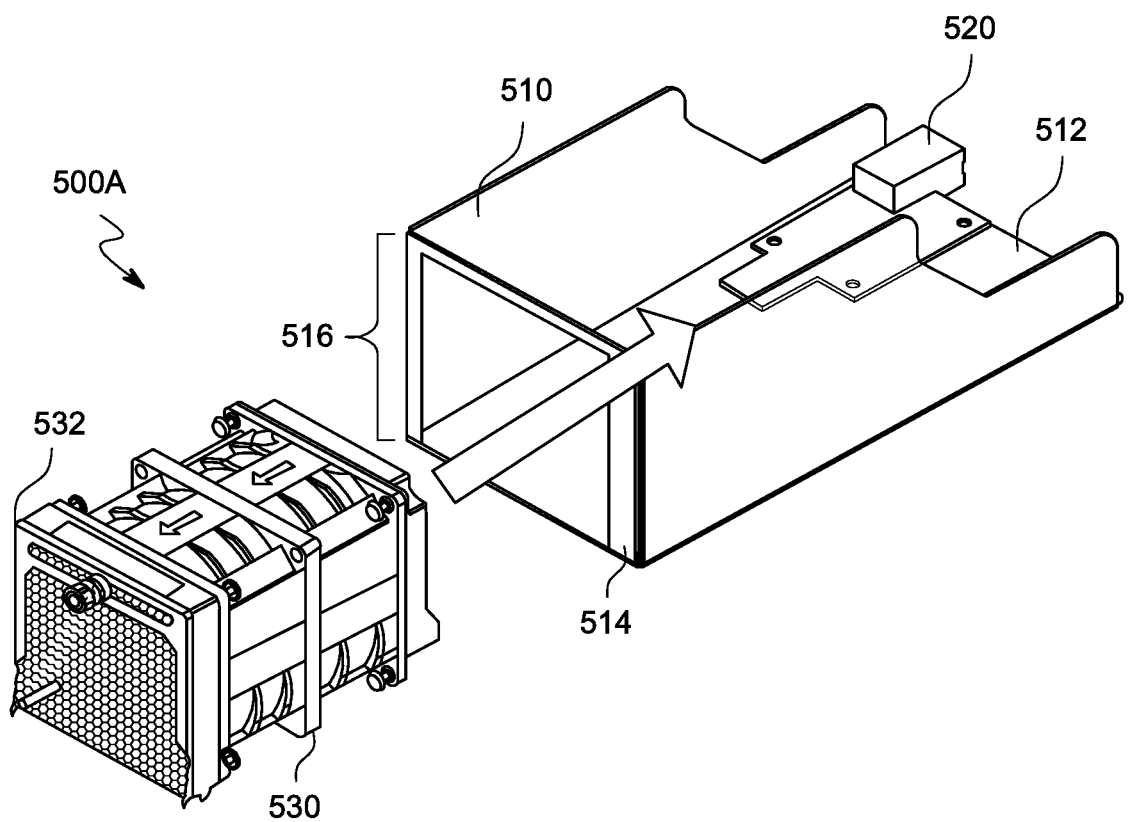
FIG. 5A shows an exploded view of an exemplary computer component expander module, according to an embodiment of the present disclosure.
Figure 5B:
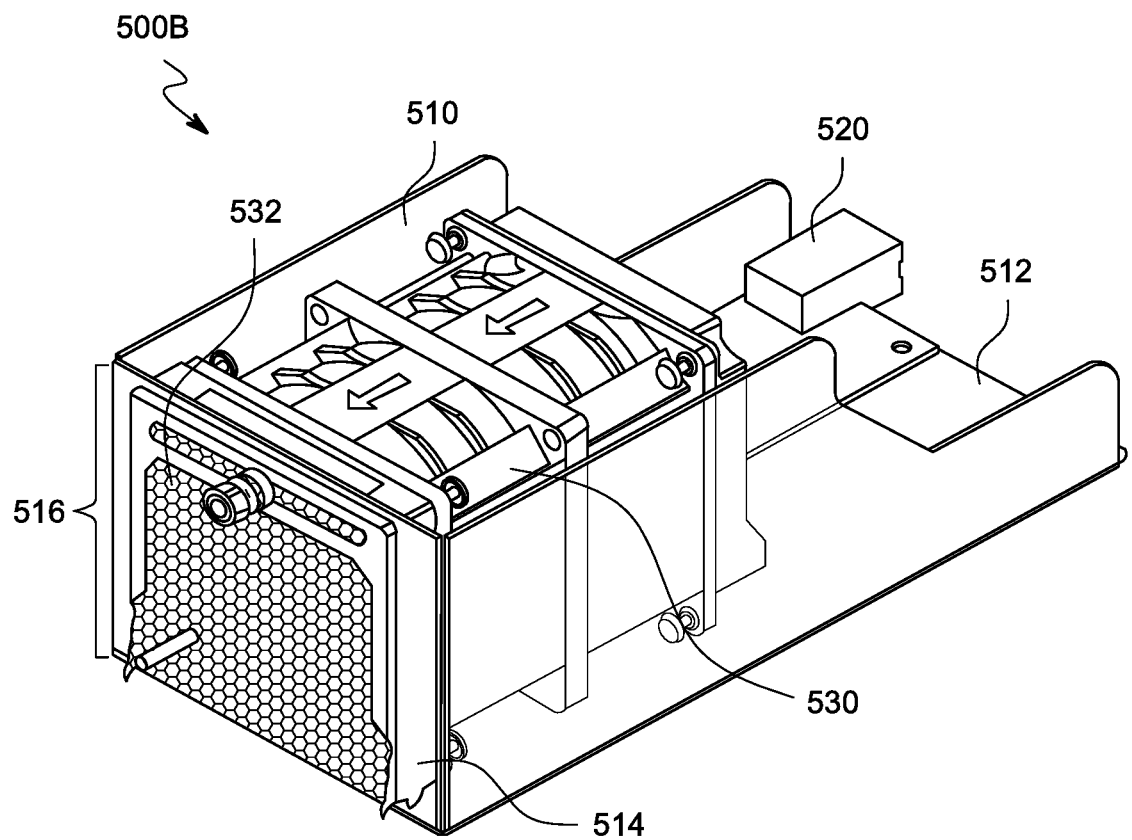
FIG. 5B shows an exemplary loaded configuration of a computer component expander module, according to an embodiment of the present disclosure.

FIG. 5A shows an exploded view of an exemplary computer component expander module 500A, according to an embodiment of the present disclosure. The expander module 500A can include a module housing 510, an adapter element 520, and at least one computer component 530. FIG. 5B shows a loaded configuration 500B of a computer component expander module 500A, according to an embodiment of the present disclosure.

The module housing 510 can provide structural support to receive at least one computer component 530. The module housing 510 can be similar in size to the module housing 130 of the add-on card module 100A of FIG. 1A. Referring back to FIG. 5A, the module housing 510 can have an adapter component 520 attached to a first end 512 of the module housing 510. The module housing 510 can have a second end 514 with at least one opening 516. The at least one opening 516 can provide space for an end portion 532 of the at least one computer component 530 to be accessed through. For example, an inlet or outlet portion of a fan can intake or expel air through the at least one opening 516.

The adapter element 520 can serve as an extension board connector to connect a motherboard and a fan module. In some examples, the adapter element 520 can be used where a depth of the fan is shorter than the expander module 500A. The adapter element 520 can also be a signal connector to receive feedback signals from fan and/or power connectors.

In some examples, the at least one computer component 530 can be a fan module 210, as discussed above with respect to FIGS. 2A-4B. The present disclosure additionally contemplates that the at least one computer component can be any removable computer component from a server system.

Therefore, a loaded configuration 500B can be loaded into an exemplary server system 200 as discussed with respect to FIGS. 2A-4B. The expander module 500A can be used when the at least one computer component has a smaller length than the add-on card module 100A. Such an expander module 500A therefore can allow a greater variety of computer components in a server system to swap with an add-on card module 100A, according to an embodiment of the present disclosure.

While various examples of the present invention have been described above, it should be understood that they have been presented by way of example only, and not limitation. Numerous changes to the disclosed examples can be made in accordance with the disclosure herein without departing from the spirit or scope of the invention. Thus, the breadth and scope of the present invention should not be limited by any of the above described examples. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A swappable add-on card module for at least one computer card, comprising:
    an adapter board including at least one connector element and at least one computer card slot communicatively coupled to the at least one connector element, the at least one computer card slot facing in a first direction, the at least one connector element facing in a second direction generally perpendicular to the first direction, wherein the at least one computer card slot is configured to receive the at least one computer card; and
    a module housing configured to receive the adapter board, wherein the module housing has a first end with at least one opening, and a second end with at least one opening opposite from the first end,
    wherein the module housing is configured to receive the adapter board and an end of the at least one computer card is configured to extend through the at least one opening of the module housing, such that the at least one computer card is supported by the module housing, and such that the at least one computer card slot is positioned adjacent to the at least one opening of the first end of the module housing and the at least one connector element is accessible at the at least one opening of the second end of the module housing, and
    wherein the at least one connector element is configured to connect the at least one computer card to corresponding connecting elements in a server system, and wherein the server system is configured to removably receive in a single opening at least the module housing with the adapter board, and an additional module housing with a fan module positioned therein.

2. The swappable add-on card module of claim 1, wherein the corresponding connecting elements are communicatively coupled to a motherboard of the server system.

3. The swappable add-on card module of claim 2, wherein the at least one computer card slot communicatively couples the at least one computer card to the the at least one connector element through the adapter board.

4. The swappable add-on card module of claim 1, wherein the at least one computer card comprises a PCie card, and the at least one computer card slot comprises a PCie card slot.

5. The swappable add-on card module of claim 1, wherein the at least one computer card slot and the at least one connector element communicatively couple the at least one computer card to a motherboard of a server system.

6. The swappable add-on card module of claim 1, wherein the swappable add-on card module is configured to fit within a front portion or a back portion of a server system.

7. A server system, comprising:
    a first end and a second end opposite the first end; and
    an opening defined in the server system located at either the first end or the second end;
    wherein the opening is configured to alternatively receive a swappable add-on card module and an expander module holding a fan,
    wherein the swappable add-on card module comprises:
        an adapter board including at least one connector element and at least one computer card slot communicatively coupled to the at least one connector element, the at least one computer card slot facing in a first direction, the at least one connector element facing in a second direction generally perpendicular to the first direction, wherein the at least one computer card slot is configured to receive at least one computer card; and
        an add-on card module housing configured to receive the adapter board, wherein the module housing has a first end with at least one opening, and a housing second end with at least one opening opposite from the first end,
        wherein the module housing is configured to receive the adapter board such that an end of the at least one computer card extends through the at least one opening and is supported by the module housing, and such that the at least one computer card slot is positioned adjacent to the at least one opening of the first end of the module housing and the at least one connector element is accessible at the at least one opening of the second end of the module housing, and
        wherein the at least one connector element of the adapter board is configured to connect the at least one computer card to corresponding connecting elements in the server system; and
    wherein the expander module comprises:
        an expander module housing configured to receive a fan module having a depth smaller than a depth of the module housing, a first end portion of the fan module being positioned at a first end of the expander module housing; and
        an adapter element positioned between a second end portion of the fan module and a second end of the expander module housing, the adapter element being configured to connect the fan module to a motherboard of the server system.

8. The server system of claim 7, wherein the motherboard is communicatively coupled to the corresponding connecting elements in the adapter board.

9. The server system of claim 8, wherein the at least one computer card slot and the at least one connector element communicatively couples the at least one computer card to the motherboard.

10. The server system of claim 7, wherein the at least one computer card comprises a PCie card, and the at least one computer card receiver comprises a PCie card slot.

11. The server system of claim 7, wherein the expander module housing is configured to alternatively receive one of a hard drive module, a solid state drive module, or an input/output port module.

12. The swappable add-on card module of claim 1, wherein the end of the at least one computer card extends through the at least one opening of the module housing such that the end of the at least one computer card is surrounded on four sides by edges of the module housing defining the at least one opening.

13. The server system of claim 7, wherein the end of the at least one computer card extends through the at least one opening of the module housing such that the end of the at least one computer card is surrounded on four sides by edges of the module housing defining the at least one opening.

* * * * *